(12) United States Patent
Kenkare et al.

(10) Patent No.: US 7,545,702 B2
(45) Date of Patent: Jun. 9, 2009

(54) MEMORY PIPELINING IN AN INTEGRATED CIRCUIT MEMORY DEVICE USING SHARED WORD LINES

(75) Inventors: Prashant Kenkare, Austin, TX (US); Ravindraraj Ramaraju, Round Rock, TX (US); Ambica Ashok, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 544 days.

(21) Appl. No.: 11/459,170

(22) Filed: Jul. 21, 2006

(65) Prior Publication Data

US 2008/0022064 A1 Jan. 24, 2008

(51) Int. Cl.
*G11C 8/10* (2006.01)
*G11C 8/14* (2006.01)

(52) U.S. Cl. .......................... 365/230.06; 365/230.03; 365/230.08; 365/233

(58) Field of Classification Search ............ 365/230.03, 365/230.06, 230.08, 233
See application file for complete search history.

(56) References Cited

U.S. PATENT DOCUMENTS

| | | | |
|---|---|---|---|
| 5,610,872 A | 3/1997 | Toda | |
| 5,615,164 A | 3/1997 | Kirihata et al. | |
| 5,621,695 A * | 4/1997 | Tran | 365/189.02 |
| 6,469,953 B1 | 10/2002 | Hong | |
| 6,760,242 B1 * | 7/2004 | Park et al. | 365/49.15 |
| 6,775,166 B2 * | 8/2004 | McKenzie et al. | 365/49.18 |
| 6,967,856 B1 * | 11/2005 | Park et al. | 365/49.16 |
| 7,355,872 B2 * | 4/2008 | Hsu et al. | 365/49.17 |
| 2004/0004901 A1 | 1/2004 | Gieseke et al. | |

* cited by examiner

*Primary Examiner*—Jack A Lane
(74) *Attorney, Agent, or Firm*—Susan C. Hill; Ranjeev Singh

(57) ABSTRACT

A method for pipelining a memory in an integrated circuit includes providing a first clock phase and providing a second clock phase, wherein the first clock phase and the second clock phase are at least partially non-overlapping. The method further includes providing a first memory array and providing a second memory array, wherein the second memory array shares a wordline with the first memory array. The method further includes using said wordline to select at least one row of the first memory array during the first clock phase. The method further includes using said wordline to select at least one row of the second memory array during the second clock phase.

20 Claims, 6 Drawing Sheets

MEMORY PIPELINING IN AN INTEGRATED CIRCUIT MEMORY DEVICE USING SHARED WORD LINES

BACKGROUND OF THE INVENTION

1. Field of the Invention

This invention relates in general to memories and more specifically to memory pipelining in an integrated circuit.

2. Description of the Related Art

A memory array typically provides output data bits during a read access that correspond to an incoming address. The output data bits can be organized in a number of different ways including individual bits, bytes, words, and lines. In embedded memory systems, it is possible to have applications where the processor (or another user) requires some portion of the output data bits sooner than other portions of the output data bits. For example, the user might prefer to have a small portion of the bits in the first phase of the clock cycle and the remainder of the bits in the second phase of the clock cycle. Hence, there is a need for a memory that will optimally fulfill the needs of the user in a manner that offers high performance while minimizing power and area.

Additionally, some cache memories are organized into an associative structure. In an associative structure, the blocks of storage locations are accessed as arrays having rows (often referred to as "sets") and columns (often referred to as "ways"). When a cache is searched for bytes residing at an address, a number of bits from the address are used as an "index" into the cache. The index selects a particular set within the array, and therefore the number of address bits required for the index is determined by the number of sets configured into the cache. The act of selecting a set via an index is referred to as "indexing." The addresses associated with bytes stored in the multiple ways of a set are examined to determine if any of the addresses stored in the set match the requested address. If a match is found, the access is said to be a "hit," and the cache provides the associated bytes. If a match is not found, the access is said to be a "miss." When a miss is detected, the bytes are transferred from the memory system into the cache. The addresses associated with bytes stored in the cache are also stored. These stored addresses are referred to as "tags" or "tag addresses."

The blocks of memory configured into a set form the columns of the set. Each block of memory is referred to as a "way"; multiple ways comprise a set. The way is selected by providing a way value to the cache. The way value is determined by examining the tags for a set and finding a match between one of the tags and the requested address. A cache designed with one way per set is referred to as a "direct-mapped cache." In a direct-mapped cache, the tag must be examined to determine if an access is a cache hit, but the tag examination is not required to select which bytes are transferred to the outputs of the cache. Since only an index is required to select bytes from a direct-mapped cache, the direct-mapped cache is a "linear array" requiring only a single value to select a storage location within it.

The hit rate in a data cache is important to the performance of a data processing system because when a miss is detected the data must be fetched from the memory system. The microprocessor will quickly become idle while waiting for the data to be provided. Set-associative caches require more access time than direct-mapped caches since the tags must be compared to the requested address and the resulting hit information must then be used to select which data bytes should be conveyed out of the data cache. As the clock frequencies of data processing systems increase, there is less time to perform the tag comparison and way selection. The problem is further compounded for processors using a wider data-path (for example, 64 bit versus 32 bit). In order to reduce the time to perform the tag comparison and way selection, some cache memories use a speculative way prediction scheme for way selection. In these schemes, the predicted way depends on a lookup and comparison of a portion of the entire tag. For instance, a tag way array may be configured as an array having an upper tag portion and a lower tag portion. The lower tag might be initially used to determined the predicted way. The prediction would be validated later once the upper tag is accessed and compared. The organization and timing of such a tag array can have a clear impact on speed, area, and power consumption. Thus, there is a need for an improved structure and method for accessing the upper tag portion and the lower tag portion of a tag way array.

Additionally, there are applications where the entire address is not immediately available at the beginning of the memory access. For example, the entire address may be known except for the least significant address bit(s). Furthermore, it is possible that only a portion of the output data bits are required in the first clock phase and the rest are required at a later time when the entire address is known including the least significant address bit(s). Hence, there is a need for an improved structure and method for accessing memories in such applications.

BRIEF DESCRIPTION OF THE DRAWINGS

The present invention may be better understood, and its numerous objects, features, and advantages made apparent to those skilled in the art by referencing the accompanying drawings.

Figure 1:
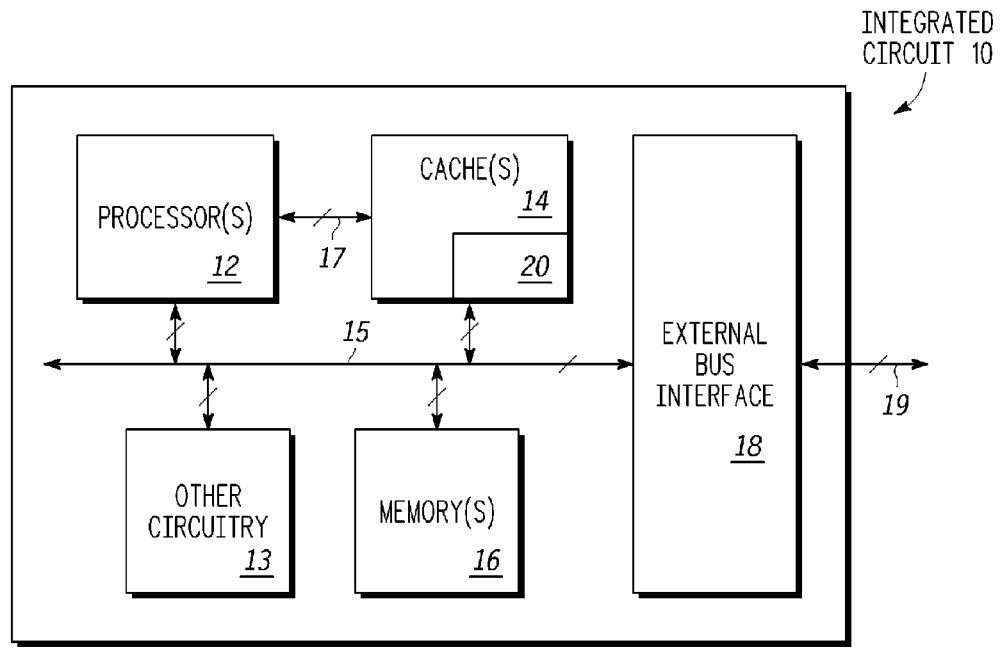
FIG. 1 shows a diagram of an exemplary integrated circuit, consistent with one embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

In one aspect, a method for pipelining a memory in an integrated circuit is provided. The method comprises providing a first clock phase and providing a second clock phase, wherein the first clock phase and the second clock phase are at least partially non-overlapping. The method further includes providing a first memory array and providing a second memory array, wherein the second memory array shares a wordline with the first memory array. The method further includes using said wordline to read the first memory array during the first clock phase. The method further includes using said wordline to read the second memory array during the second clock phase.

In another aspect, an integrated circuit having a pipelined cache is provided. The pipelined cache comprises an information array having a plurality of ways. The pipelined cache further comprises a tag array having a first tag portion and a second tag portion, wherein the first tag portion is accessed during a first clock phase, and wherein the second tag portion is accessed during a second clock phase, wherein the first clock phase and the second clock phase are at least partially non-overlapping. The pipelined cache further comprises compare circuitry coupled to said tag array and said information array.

In yet another aspect, a method for pipelining a memory in an integrated circuit is provided. The method comprises providing a first clock phase and providing a second clock phase, wherein the first clock phase and the second clock phase are at least partially non-overlapping. The method further includes providing a first memory array and providing a second memory array, wherein the second memory array shares a first wordline with the first memory array. The method further includes providing a third memory array and providing a fourth memory array, wherein the fourth memory array shares a second wordline with the third memory array. The method further includes using said first wordline to read the first memory array and provide a first read output during the first clock phase. The method further includes using said second wordline to read the third memory array and provide a third read output during the first clock phase. The method further includes receiving a select signal and using the select signal to select one of the first read output and the third read output. The method further includes using the select signal to determine whether to read the second memory array or the fourth memory array during the second clock phase.

FIG. 1 shows an exemplary integrated circuit 10. Integrated circuit 10 may correspond to any information processing circuit. Integrated circuit 10 may include processor(s) 12, other circuitry 13, cache(s) 14, memory(s) 16, and external bus interface 18. Internal components of integrated circuit 10 may be interconnected via bus 15. Integrated circuit 10 may interface to external components via external bus 19. Although FIG. 1 shows a specific type, number, and arrangement of components within integrated circuit 10, integrated circuit 10 may comprise other type, number, and arrangement of components. Processor(s) 12 may be one or more of a microprocessor, a microcontroller, or a digital signal processor. Processor(s) 12 may be a 64-bit or a higher bit processor. Processor(s) 12 may be operating at a frequency equal to or above 2 GHz. Further, although FIG. 1 shows separate memory(s) 16 and cache(s) 14, integrated circuit 10 may only have one of these or the two may be combined into one element. Cache(s) 14 may be any type of cache. Cache(s) 14 may include a portion 20, which is further described with respect to FIG. 2. Further, although FIG. 1 shows portion 20 as part of cache(s) 14, portion 20 may be a part of memory(s) 16. Cache(s) 14 may be part of the memory management unit or part of a level one cache in a system having a level two memory.

Figure 2:
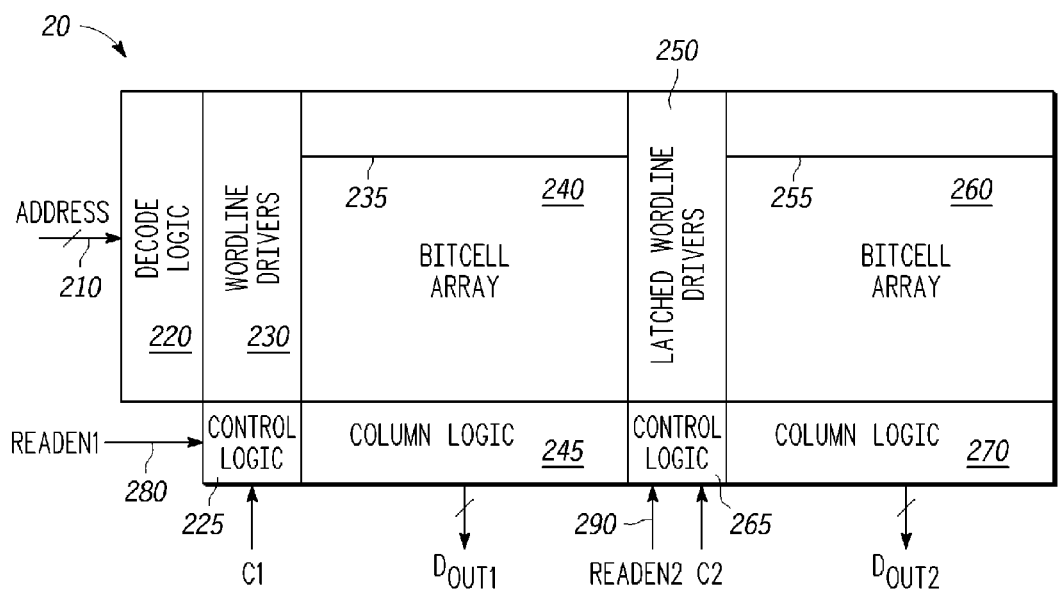
FIG. 2 shows a diagram of a portion of an exemplary memory or an exemplary cache, consistent with one embodiment of the invention.

Referring now to FIG. 2, portion 20 of cache(s) 14 or memory(s) 16 may include a first bitcell array 240 and a second bitcell array 260. Note that bitcell array 240 and bitcell array 260 may be pitch-matched in the wordline direction. Although FIG. 2 shows two bitcell arrays, portion 20 may include additional bitcell arrays (such as three, four, six, or more bitcell arrays). Portion 20 may further include a decode logic 220 for first bitcell array 240 and a second bitcell array 260. Portion 20 may further include wordline drivers 230, control logic 225, and column logic 245 for bitcell array 240. Portion 20 may further include latched wordline drivers 250, control logic 265, column logic 270 for bitcell array 260. Column logic 245 and 270 may generate data ($D_{OUT1}$ and $D_{OUT2}$) respectively under the control of control signals, generated, for example by control logic 225 and 265. Although FIG. 2 shows latched wordline drivers 250 arranged between first bitcell array 240 and second bitcell array 260, latched wordline drivers 250 may be arranged between wordline drivers 230 and first bitcell array 240 or any other suitable location. Column logic 245 may provide data dout1 and column logic 270 may provide data dout2. A read enable (READEN1) signal 280 may be coupled to control logic 225 and a read enable (READEN2) signal 290 may be coupled to control logic 265. First bitcell array 240 may be pitch-mapped to second bitcell array 260.

A first clock C1 may be used to clock control logic 225 associated with the first bitcell array. A second clock C2 may be used to clock control logic 265 associated with the second bitcell array. The first clock C1 may have a phase that is at least partially non-overlapping with a phase of the second clock C2. Decode logic 220 may decode an address received on address line 210 and select a wordline 235. Alternatively, decode logic 220 may decode a received address and convert it into pre-decoded terms which are sent to individual wordline drivers. The selected wordline 235 may be used to read first bitcell array 240 using the first clock C1 and a latched wordline 255 may be used to read second bitcell array 260 using the second clock C2. Wordline 235 and latched wordline 255 each corresponds to the same values of address line 210, and hence, share the same identical wordline decoder that is a part of the decoder logic 220. The main difference is that wordline 235 is asserted in one phase of the clock while wordline 255 is asserted in the next phase of the clock. It should be noted that one of the latched wordline drivers 250 may be used to latch wordline 235 and the latched wordline 255 may be asserted to read second bitcell array 260. The first clock C1 and the second clock C2 may be ninety percent non-overlapping, fifty percent overlapping, or any suitable percentage non-overlapping. The first clock C1 and the second clock C2 may be the same clock signal and the two phases of the clock signal may be used to clock the control logic (225 and 265) of the two bitcell arrays. The first clock C1 may have the same duty cycle or a different duty cycle from the duty cycle of the second clock C2. The advantage of the scheme shown in FIG. 2 is that a memory array can be organized into two portions: a first portion whose contents need to be known sooner, and a second portion whose contents can be accessed later. For example, bitcell array 240 can represent the first portion, while bitcell array 260 can represent the second portion. Access time of a memory portion can be speeded up if it has a wordline of shorter length. Hence, it is now possible for bitcell array 240 to have a shorter wordline 235 as compared to the case where both bitcell arrays 240 and 260 were combined into one larger memory array with all the contents being accessed at the same time.

Figure 3:
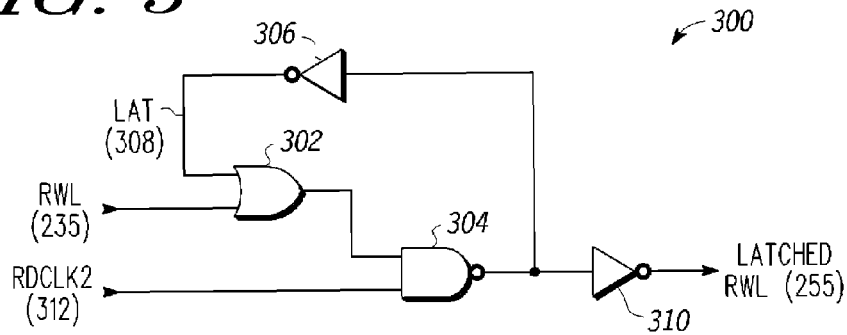
FIG. 3 shows a diagram of a portion of an exemplary latched wordline driver, consistent with one embodiment of the invention.

FIG. 3 shows a portion 300 of latched wordline drivers 250. Portion 300 of latched wordline drivers 250 may be used to latch a wordline. Wordline (referred to as RWL (235)) may be coupled to one input of an OR gate 302. An output of OR gate 302 may be coupled to one input of a NAND gate 304. A signal RDCLK2 312 corresponding to a logical "AND" of the second clock C2 and read enable READEN2 290 may be coupled to the other input of NAND gate 304. An output of NAND gate 304 may be coupled to an input of an inverter 310. The output of NAND gate 304 may be coupled to an inverter 306, which may generate an output LAT (308), which in turn may be coupled to the other input of OR gate 302. Inverter 310 may generate latched read wordline (RWL) 255 output. In operation, when signal RDCLK2 312 is low, the output of NAND gate 304 is high regardless of the state of the other input to NAND gate 304. Thus, the output LATCHED RWL (255) of inverter 310 is low. In addition, the output LAT (308) of inverter 306 is low, which is fed as an input to OR gate 302. Hence, the output of the OR gate now directly represents input signal RWL 235. Signal RDCLK2 312 goes high when clock signal C2 and signal READEN2 are both high. For this case, the output of NAND gate 304 generates an inverse of the signal corresponding to read wordline (RWL) 235. If the read wordline (RWL) 235 is high, then the output of NAND gate 304 is low and thus the latched read wordline (RWL) 255 is asserted high and the output LAT (308) of inverter 306 goes high, which in turn renders OR gate 302 insensitive to the state of read wordline (RWL) 235. On the other hand, if the read wordline (RWL) 235 is low, then the output of NAND gate 304 remains high and thus the output latched read wordline (RWL) 255 of inverter 310 remains low. When RDCLK2 312 goes low, the output of NAND gate 304 goes high, which in turn de-asserts the latched read wordline (RWL) 265 and resets the output LAT (308) of inverter 306. Signal RDCLK2 312 may transition from low to high even prior to when read wordline (RWL) 235 goes high. Thus, there is no setup time requirement for read wordline (RWL) 235 transitioning high with respect to signal RDCLK2 transitioning high. In particular, read wordline (RWL) signal can transition high before, during, or after RDCLK2 goes high. Although FIG. 3 shows a specific implementation of a portion of latched wordline drivers 250 containing specific logic gates, there are other implementations which would be apparent to those possessing ordinary skill in the art.

Figure 4:
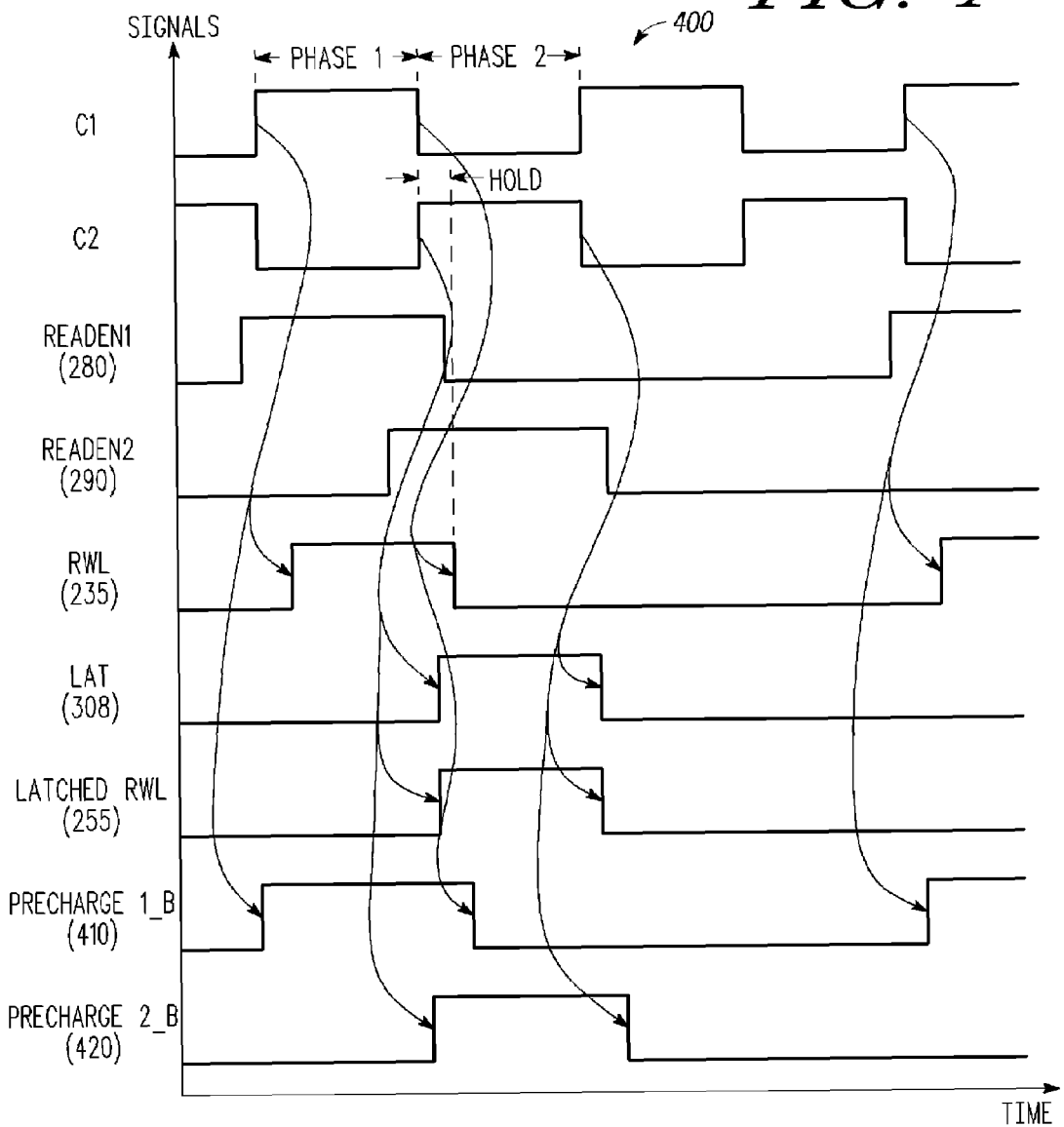
FIG. 4 shows an exemplary timing diagram for signals at various nodes of a portion of an exemplary memory or an exemplary cache, consistent with one embodiment of the invention.

FIG. 4 shows an exemplary timing diagram 400 for signals at various nodes of a portion of an exemplary memory or an exemplary cache, consistent with one embodiment of the invention. By way of example, first clock C1 shown in timing diagram 400 may be used to clock control logic 225 associated with the first bitcell array and second clock C2 may be used to clock control logic 265 associated with the second bitcell array. FIG. 4 also shows a read enable signal (READEN1 (280)) for control logic 225 associated with the first bitcell array and a second read enable signal (READEN2 (290)) for control logic 265 associated with the second bitcell array. When first clock C1 goes high, read wordline (RWL) 235 goes high and pre-charge signal PRECHARGE1_B for first bitcell array 240 goes high. At this time, however, pre-charge signal PRECHARGE2_B for second bitcell array 260 is low and thus second bitcell array is being pre-charged in phase 1 (PHASE 1). When first clock CI goes low, read wordline (RWL) 235 goes low and pre-charge signal PRECHARGE1_B for first bitcell array 240 goes low. When second clock signal C2 goes high, as explained above with respect to FIG. 3, LAT (308) signal goes high and latched read wordline (LATCHED RWL (255)) goes high. When clock signal C2 goes low, as explained above with respect to FIG. 3, latched read wordline (RWL) 255 goes low and LAT (308) signal goes low. Although FIG. 4 shows a specific timing arrangement for two bitcell arrays, other timing arrangements may also be used for two bitcell arrays or additional bitcell arrays. Further, as shown in FIG. 4, read wordline RWL 235 should be held long enough (referred to as HOLD time in timing diagram 400) so that read wordline RWL 235 is latched into a latch corresponding to latched wordline drivers 250.

Figure 5:
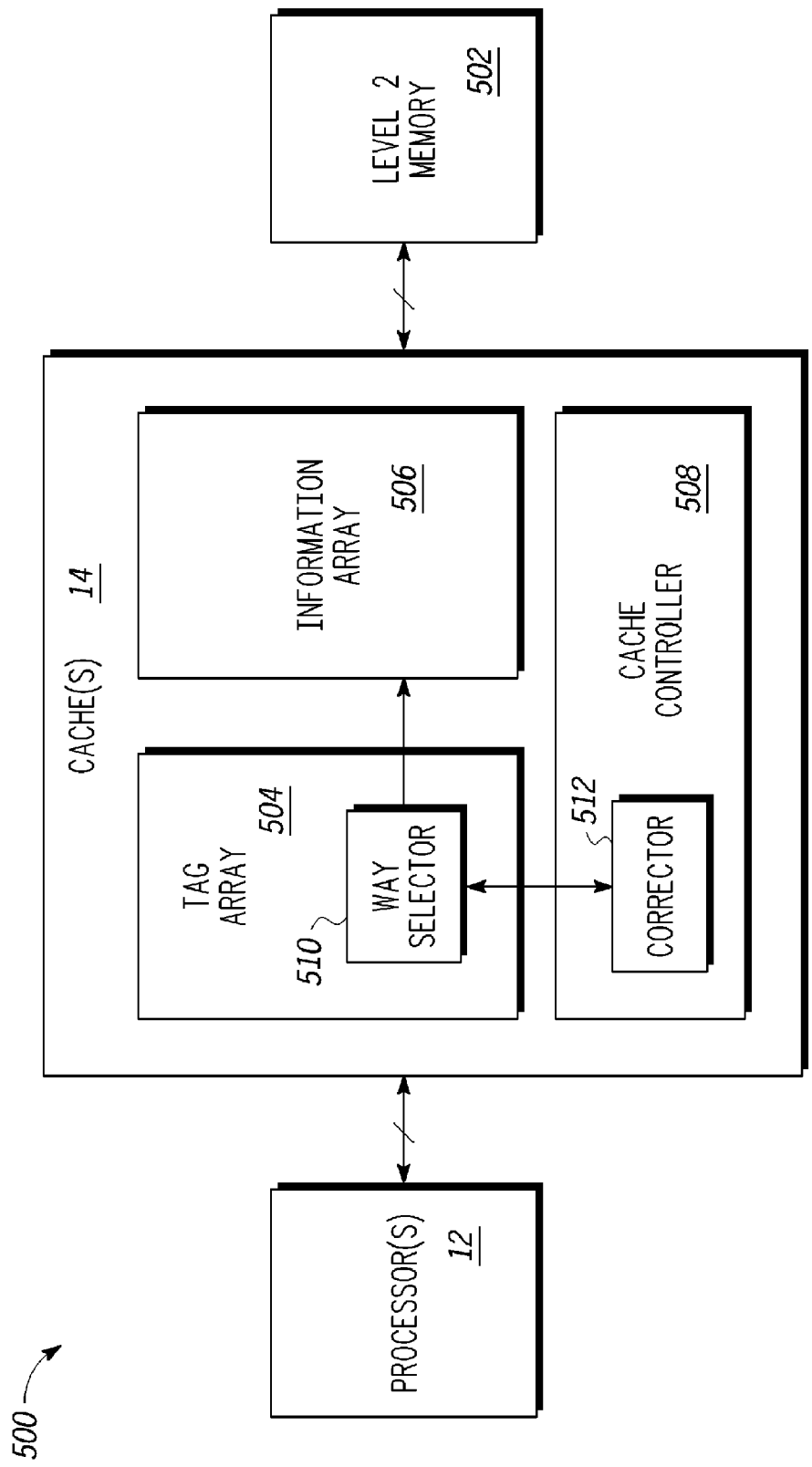
FIG. 5 shows a diagram of an exemplary cache including a tag array and an information array, consistent with one embodiment of the invention.

FIG. 5 shows a diagram of an exemplary cache 14 which may be used along with processor 12 and a level 2 memory 502, consistent with one embodiment of the invention. Exemplary cache 14 may include a tag array 504 and an information array 506. Tag array 504 and information array 506 may further comprise a plurality of tag entries and information entries. The information entries may include data information or instruction information corresponding to information stored in level 2 memory 502. The tag entries are a type of address information. Tag array 504 may include a way selector 510. Cache 14 may also include a cache controller 508 including a prediction corrector 512.

Figure 6:
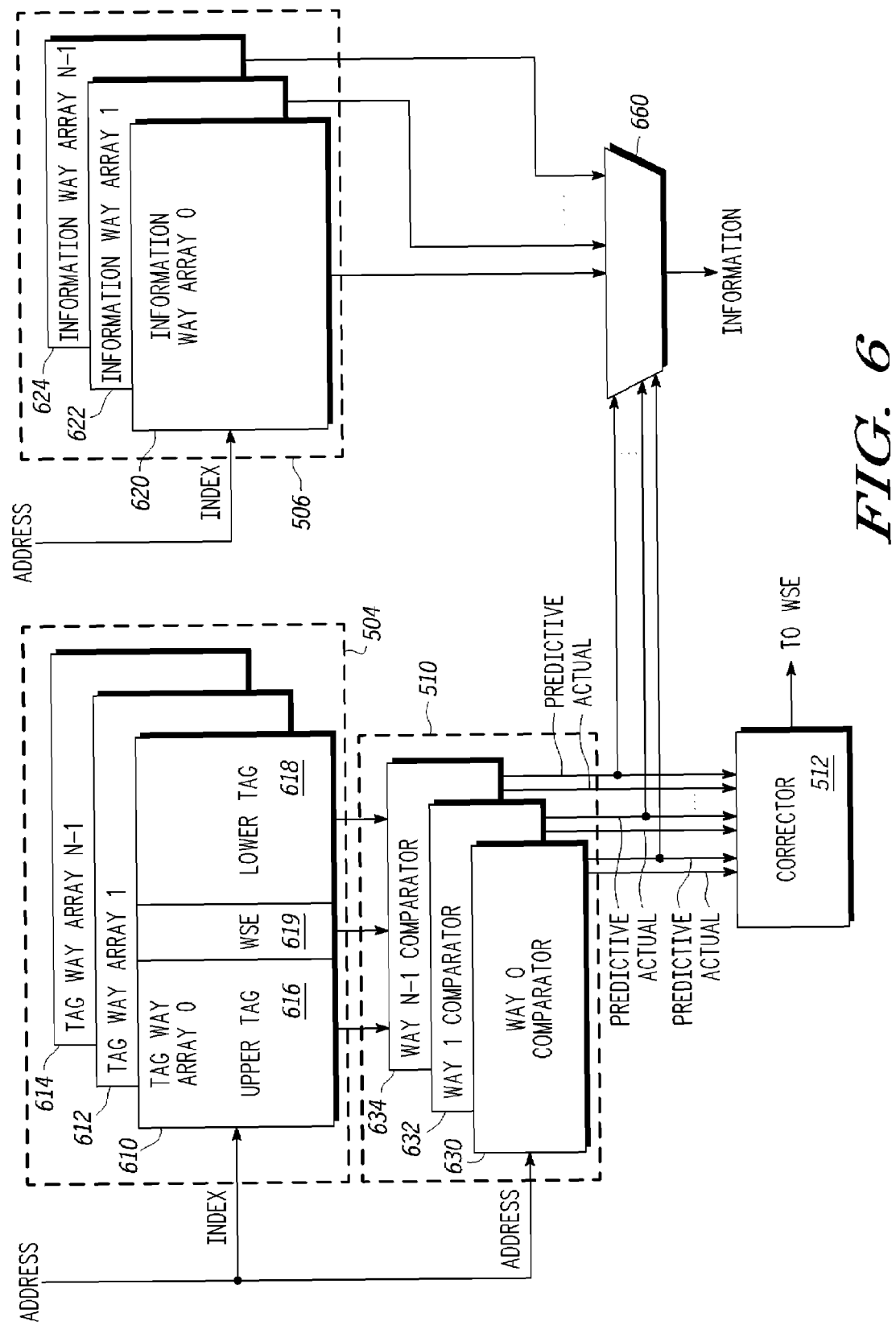
FIG. 6 shows a diagram of an exemplary tag array, consistent with one embodiment of the invention.

FIG. 6 shows a diagram that includes exemplary tag array 504, consistent with one embodiment of the invention. The tag array 504 may include N tag way arrays 610, 612, and 614 (i.e., tag way 0, tag way 1, . . . tag way N−1) where each way includes multiple rows of address tags. Each address tag is subdivided into an upper tag portion 616, a lower tag portion 618, and a one-bit way select enable (hereinafter "wse") 619. The wse 619 may be referred to as a field, a predictive hit field, or any other suitable term. Note that the wse bit 619 could be located anywhere in the tag. Also note that the tag ways can be divided into upper and lower tag portions in any desired way. In one example, for a 64-bit architecture, the upper tag portion is comprised of bits [0:31] of the address and the lower tag portion is comprised of bits [32:51] of the address. The remaining bits may be allocated for index and offset information.

Each address tag in each way is associated with a corresponding memory location in the information array 506. Information array 506 includes N information way arrays 620, 622, and 624 (i.e., information way 0, information way 1, . . . information way N−1). For any given index value (from an address corresponding to an information request from data processor 12, for example) information from one of the ways 620, 622, or 624 depending on the result of the way selector 510 may be selected.

The tag array 504 is coupled to N way comparators 630, 632, and 634 (i.e., way 0 comparator, way 1 comparator, . . . way N−1 comparator), each corresponding to one of the tag way arrays. The detail of an exemplary way comparator is provided with respect to FIG. 7. Each way comparator includes three inputs coming from the upper tag 616, lower tag 618, and wse 619 of its corresponding tag way array. Therefore, the information contained in the upper tag 616, lower tag 618, and wse 619 of the selected row of each way is provided as an input to the way comparator. For example, the information in the upper tag 616 of the tag way 0 array 610 provides the input to the upper tag input of the way 0 comparator 630. Each way comparator includes an actual hit output and a predictive hit output (described below). The actual hit and predictive hit outputs are provided as inputs to the corrector 512 which corrects the value of the wse 619 where necessary. The predictive hit outputs are also provided to multiplexer 660. The values of the predictive hit outputs determine which of the information ways is selected to provide information to processor 12, for example. In one embodiment, lower tag 618 is accessed during a first clock phase (related to clock C1, for example) and upper tag 616 is accessed during a second clock phase (related to clock C2, for example). FIG. 8 shows a diagram of an exemplary address 800 for accessing the exemplary cache of FIG. 5, consistent with one embodiment of the invention. The example shown in FIG. 8 is a q-bit address. A first portion of the address 800 is labeled "offset" and includes bits [0 to n]. The purpose of the offset information is to tell the system where the relevant data is located within a block in the information array. A second portion of the address is labeled "index" and includes bits [n+1 to m]. The purpose of the index information is to tell the system in which row of the array the relevant data is located. The index information can therefore provide indexed tag information including indexed predictive hit information. Third and fourth portions of the address are labeled "lower" and "upper" and include bits [m+1 to p] and [p+1 to q], respectively. The lower and upper portions together form the tag information. The purposes of the lower and upper information are described below. FIG. 8 is merely exemplary, in that address 800 may have fewer or more bits organized in a different fashion.

Referring again to FIG. 7, by way of example, all of the way comparators are identical, so only way 0 comparator 630 is shown and described. The way comparator 630 includes an upper comparator 710 and a lower comparator 720. The function of the lower comparator 720 is to compare the selected lower tag 618 in the tag way 610 with the lower portion of the requested address 800 (see FIG. 8). The output of the lower comparator 720 is sent to a first AND gate 730 and a second AND gate 740. The output of the lower comparator 720 will be "true" when the compared data is the same (a lower "hit", or a "preliminary predictive hit") and "false" when the compared data is not the same. Note that the convention of "true" or "false" can be reversed, or other conventions used. By way of example, a first portion of the received tag (corresponding to requested address) may be compared with an lower tag 618 during the first clock phase to determine a speculative way select for information array 506 and the remainder of the received tag may be compared with a upper tag 616 during the second clock phase to determine the validity of the speculative way select for information array 506. The upper tag 616 and lower tag 618 share a wordline (for example, the combination of read wordline 235 and latched wordline 255). The cache shown in FIG. 5 may further include a latched wordline driver or at least a latch as shown with respect to FIG. 2. The latched wordline driver may store the wordline (for example, 235) corresponding to the lower tag 618, such that the latched wordline (for example, 255) can be used while accessing the upper tag 616. The AND gate 740 has a second input corresponding to wse 619 in the tag way 0 array 610. Input wse 619 is also provided at the same time as lower tag 618 during the first clock phase. As a preferred embodiment, both the lower tag 618 and wse 619 will be part of the same physical tag array that will be accessed in the first clock phase in response to the index input. In one embodiment, wse 619 will either be a "0" or a "1" (described below). Note that the wse 619 may also have a reversed or different convention. When the output of the lower comparator 720 is "true" and the wse bit is a "1", the output of the AND gate 740 will be true (a "predictive hit"). Otherwise, the output is false. The output of the AND gate 740 is sent to the multiplexer 660 and the corrector 512. As is described below, no more than one output of the way comparators 630, 632, and 634 will be true. Therefore, the way comparator which generates a predictive hit will cause the multiplexer 660 to select the information in the information array 620, 622, or 624 corresponding to the tag way array 610, 612, or 614 which resulted in the predictive hit. The output of the AND gate 730 is also sent to the corrector 512 for changing the wse 619 value (described below).

Figure 7:
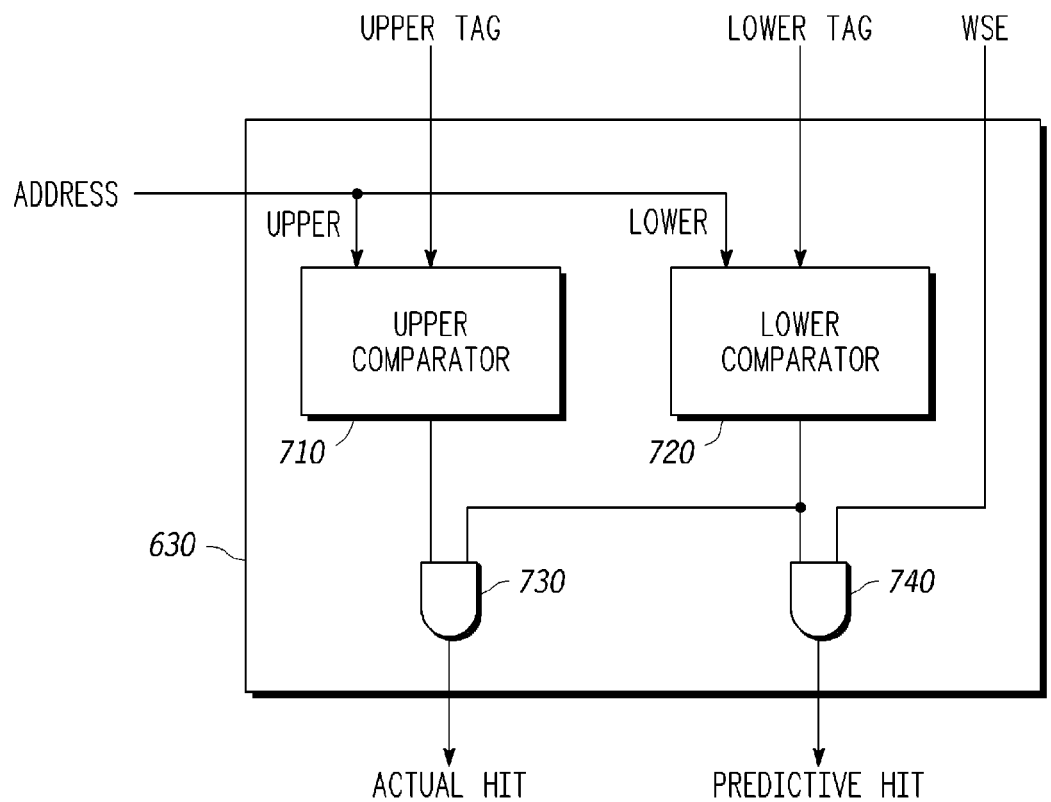
FIG. 7 shows a diagram of an exemplary way comparator, consistent with one embodiment of the invention.
Figure 8:
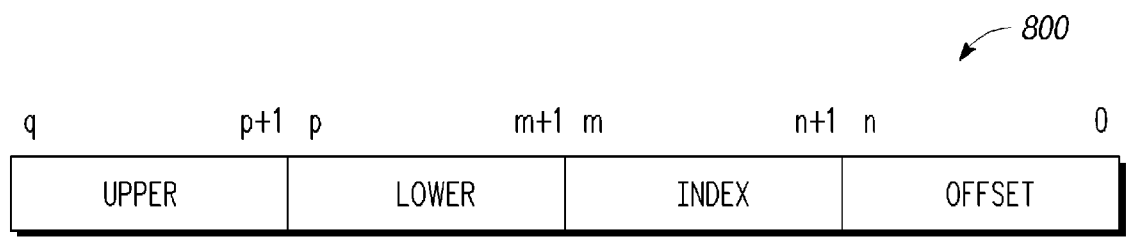
FIG. 8 shows a diagram of an exemplary address for accessing the exemplary cache of FIG. 5, consistent with one embodiment of the invention.

The function of the upper comparator 710 shown in FIG. 7 is to compare the selected upper tag 616 in the tag way 0 array 610 with the upper portion of the requested address 800 (see FIG. 8). The output of the upper comparator 710 is sent to the second AND gate 730. The output of the upper comparator 710 will be "true" when the compared data is the same (an upper "hit") and "false" when the compared data is not the same. The output of the AND gate 730 is true when the outputs of the upper and lower comparators 710 and 720 are both true (an "actual hit"). It should be noted that the output of the lower comparator 720 might be latched prior to being coupled to AND gate 730. This might be necessary when the two comparators are operated in two different phases of the clock. The output of the AND gate 730 is sent to the corrector 512 and used for changing the wse 619 value if necessary (described below). Note that other inputs to the AND gates 730 and 740 may also be used. For example, the tag way arrays could include a "valid" portion having a "valid" bit. In this example, the information in the tag way arrays could be flagged as "valid" or "invalid" by changing the value of the valid bit. The AND gates 730 and 740 may then each include a third input connected to the valid bit such that the cache will not be accessed when the requested address is flagged as invalid. This and other inputs or flags may also be used, but are not shown for purposes of clarity. Note that the function of AND gates 730 and 740, which operate as combinational logic, may be implemented by other circuitry or other types of circuit modules (or "combinational module") performing an equivalent function. The embodiment described in FIGS. 5, 6, 7, and 8 have a higher performance. The tag array access and compare operations occur over two clock phases. Typically, the more critical access is reading the lower tag 618 and wse 619 in the first clock phase. A further operation is comparison of the lower tag 618 with a portion of the incoming address 800. The upper tag 616 may be accessed and compared to the remaining portion of incoming address 800 in the second clock phase. This partitioning of array access and compare operations into two separate clock phases ensures that both the tag array portion and comparator portion being operated in the first clock phase are physically smaller thereby allowing higher performance, as compared to the case where the upper and lower tags are accessed and compared at the same time. In a preferred embodiment, the lower tag 618 is substantially smaller than the upper tag 616. In this preferred embodiment, it follows that the lower comparator 720 is substantially narrower than upper comparator 710. For example, lower comparator 720 may be 16 bits wide, while upper comparator 710 may be 32 bits wide.

Figure 9:
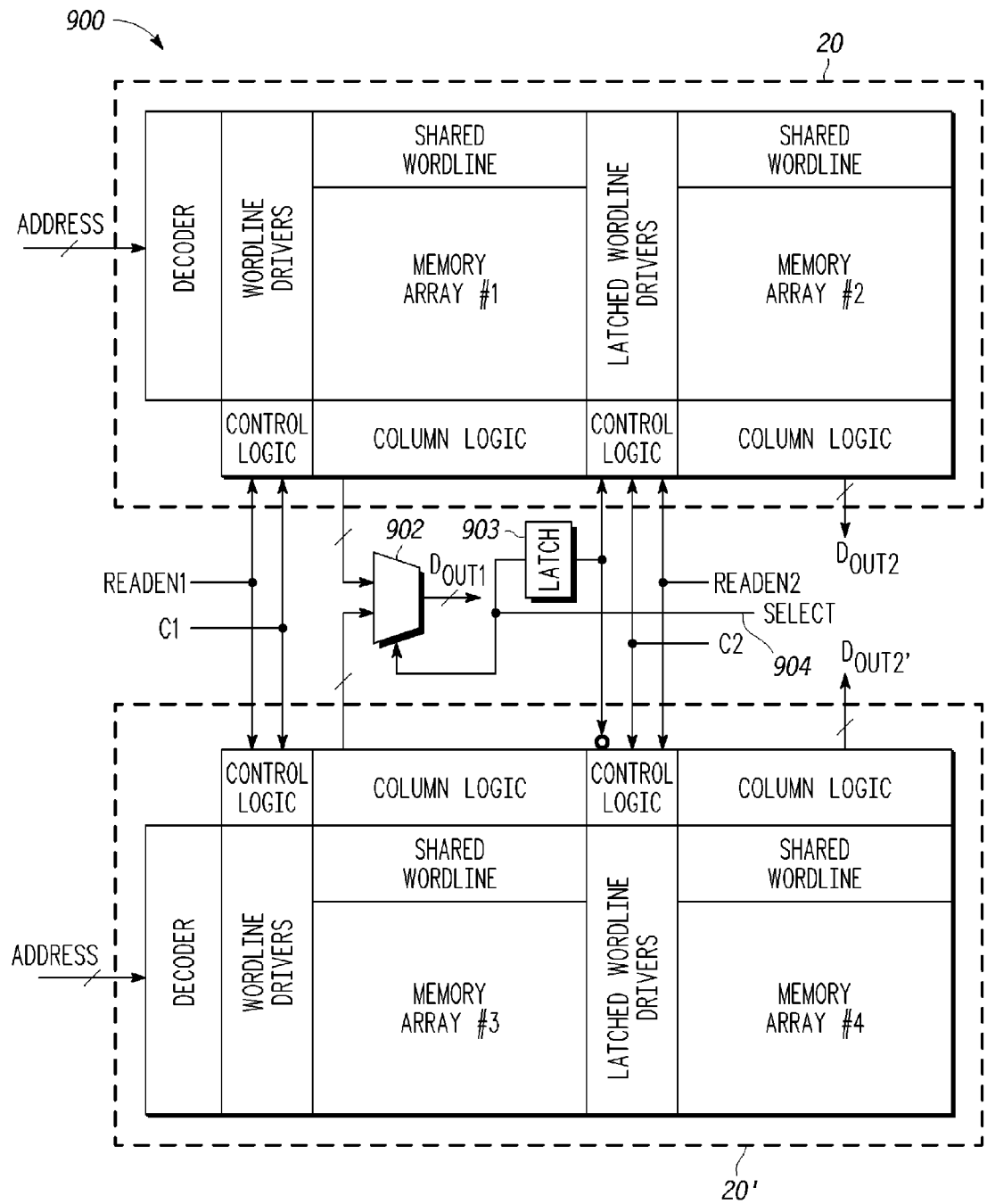
FIG. 9 shows a diagram of an exemplary memory system, consistent with one embodiment of the invention.

FIG. 9 shows a diagram of an exemplary memory system 900, consistent with one embodiment of the invention. Memory system 900 may include four bitcell arrays: memory array #1, memory array #2, memory array #3, and memory array #4, which may make up two portions 20 and 20'. The specific details of these portions 20 and 20' are similar to the portion 20 described above with respect to FIGS. 2-4 and thus are not repeated here. First memory array and second memory array of portion 20 may share a wordline (indicated as shared wordline in FIG. 9) and third memory array and fourth memory array may share a different wordline (indicated as a shared wordline in FIG. 9). The first wordline may be used to read the first memory array and provide a first read output during the first clock phase (for example, corresponding to first clock signal C1). The second wordline may be used to read the third memory array and provide a third read output during the first clock phase. Memory system 900 may receive a select signal 904. Select signal 904 may be used to select one of the first read output and the third read output. Further, select signal 904 may be used to determine whether to read the second memory array or the fourth memory array during the second clock phase. Select signal 904 may be coupled to multiplexer 902 which may couple the column logic corresponding to the selected memory array to data output (dout1). Select signal 904 may be latched using a latch 903 (labeled as LATCH) prior to being coupled to control logic blocks associated with memory array #2 and memory array #4. Among other advantages, one advantage of the embodiment shown in FIG. 9 is that it achieves an optimum balance between speed and power. For example, both memory array #1 and memory array #3 are speculatively read in the first clock phase prior to receiving select signal 904. Although, this consumes power, it produces the desired data in the required time. On the other hand, a version of the select signal 904 is used to choose between accessing memory array #2 and memory array #4. This saves power on an access where the data is not needed till the second clock phase.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

The term "assert" is used when referring to the rendering of a signal into its logically true or logically false state. If the logically true state is a logic level one, the logically false state is a logic level zero. And if the logically true state is a logic level zero, the logically false state is a logic level one. Therefore, each signal described herein may be designed as positive or negative logic, where negative logic can be indicated by a _B following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for pipelining a memory in an integrated circuit, comprising:
   providing a first clock phase;
   providing a second clock phase, wherein the first clock phase and the second clock phase are at least partially non-overlapping;
   providing a first memory array;
   providing a second memory array, wherein the second memory array shares a wordline with the first memory array;
   using said wordline to select at least one row of the first memory array during the first clock phase; and
   using said wordline to select at least one row of the second memory array during the second clock phase.

2. A method as in claim 1, wherein the first clock phase and the second clock phase are at least ninety percent non-overlapping.

3. A method as in claim 1, wherein the first clock phase comprises a high phase of a clock signal and the second clock phase comprises a low phase of said clock signal.

4. A method as in claim 1, wherein the first clock phase and the second clock phase are provided by different clock signals.

5. A method as in claim 1, further comprising:
   decoding an address to provide a decoded address;
   using the decoded address to select said wordline to read the first memory array during the first clock phase; and
   using the decoded address to again select said wordline to read the second memory array during the second clock phase.

6. A method as in claim 1, further comprising:
   latching the wordline to store a wordline value; and
   using the wordline value to drive the wordline during reading of the second memory array.

7. A method as in claim 1, wherein a transition of the wordline arrives at latching circuitry before, concurrent with, or after a first edge of the second clock phase.

8. A method as in claim 1, wherein the memory comprises a cache tag portion.

9. A method as in claim 8, wherein the cache tag portion is greater than sixteen bits.

10. A method as in claim 8, wherein the cache tag portion operates at a frequency greater than two gigahertz.

11. A method as in claim 1, further comprising:
    providing a third clock phase;
    providing a third memory array, wherein the third memory array shares the wordline with the first memory array and the second memory array; and
    using said wordline to select at least one row of the third memory array during the third clock phase.

12. A method as in claim 1, wherein the first memory array and the second memory array are pitch matched in a direction of the wordline.

13. An integrated circuit having a pipelined cache, the pipelined cache comprising:
    An information array having a plurality of ways;
    a tag array having a first tag portion and a second tag portion, wherein the first tag portion is accessed during a first clock phase, and wherein the second tag portion is accessed during a second clock phase, wherein the first clock phase and the second clock phase are at least partially non-overlapping; and
    compare circuitry coupled to said tag array and said information array.

14. An integrated circuit as in claim 13, wherein said compare circuitry compares a first portion of a received address with an output of the first tag portion during the first clock phase to determine a speculative way select for the information array, and which compares a second portion of the received address with an output of the second tag portion during the second clock phase to determine validity of the speculative way select for the information array.

15. An integrated circuit as in claim 13, wherein the first tag portion and the second tag portion share a wordline, wherein the pipelined cache further comprises latching circuitry which stores the wordline from the first tag portion, and wherein said latching circuitry drives said wordline in the second tag portion.

16. An integrated circuit as in claim 15, wherein a transition of the wordline arrives at the latching circuitry before, concurrent with, or after a first edge of the second clock phase.

17. A method as in claim 13, wherein the pipelined cache operates at a frequency greater than two gigahertz.

18. A method for pipelining a memory in an integrated circuit, the method comprising:
    providing a first clock phase;
    providing a second clock phase, wherein the first clock phase and the second clock phase are at least partially non-overlapping;
    providing a first memory array;
    providing a second memory array, wherein the first memory array and the second memory array share a first wordline;
    providing a third memory array;
    providing a fourth memory array, wherein the third memory array and the fourth memory array share a second wordline;
    using said first wordline to select at least one row of the first memory array and provide a first output during the first clock phase;
    using said second wordline to select at least one row of the third memory array and provide a third output during the first clock phase;
    receiving a select signal;
    using the select signal to select one of the first output and the third output; and
    using the select signal to determine whether to select the at least one row of the second memory array or at least one row of the fourth memory array during the second clock phase.

19. A method as in claim 18, wherein the select signal represents a least significant bit of an address.

20. A method as in claim 18, wherein the select signal is stored.

* * * * *